United States Patent
Liu et al.

(10) Patent No.: US 10,468,271 B2
(45) Date of Patent: Nov. 5, 2019

(54) DRY ETCHING METHOD

(71) Applicant: BOE TECHNOLOGY GROUP CO., LTD., Beijing (CN)

(72) Inventors: Qingzhao Liu, Beijing (CN); Jiushi Wang, Beijing (CN); Lei Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/108,185

(22) Filed: Aug. 22, 2018

(65) Prior Publication Data
US 2019/0080928 A1    Mar. 14, 2019

(30) Foreign Application Priority Data
Sep. 13, 2017    (CN) .......................... 2017 1 0824129

(51) Int. Cl.
| | | |
|---|---|---|
| *H01L 21/321* | (2006.01) | |
| *H01L 21/3213* | (2006.01) | |
| *H01L 29/786* | (2006.01) | |
| *H01L 29/66* | (2006.01) | |
| *H01L 29/423* | (2006.01) | |

(52) U.S. Cl.
CPC .... *H01L 21/3213* (2013.01); *H01L 29/42384* (2013.01); *H01L 29/6675* (2013.01); *H01L 29/66742* (2013.01); *H01L 29/786* (2013.01)

(58) Field of Classification Search
CPC .................................................. H01L 21/3213
USPC ......................................................... 438/706
See application file for complete search history.

(56) References Cited

U.S. PATENT DOCUMENTS

2004/0018734 A1*  1/2004  Schermerhorn .... B81C 1/00412
                                                       438/700

FOREIGN PATENT DOCUMENTS

| CN | 101436536 A | 5/2009 |
|---|---|---|
| CN | 102473633 A | 5/2013 |
| CN | 105390387 A | 3/2016 |
| CN | 105590846 A | 5/2016 |

OTHER PUBLICATIONS

First Office Action for Chinese Patent Application No. 201710824129.8 dated May 13, 2019.

* cited by examiner

*Primary Examiner* — Roberts P Culbert
(74) *Attorney, Agent, or Firm* — Calfee, Halter & Griswold LLP

(57) ABSTRACT

A dry etching method, including: etching a silicon-containing thin film with a first gas by a first preset thickness; etching the silicon-containing thin film with a second gas by a second preset thickness, to remove etching residues generated after etching the silicon-containing thin film by the first preset thickness; after the etching residues are removed, etching the silicon-containing thin film with the first gas by a third preset thickness, which is less than the first preset thickness; wherein the first gas includes chlorine gas, and the second gas includes fluoride gas.

16 Claims, 2 Drawing Sheets

DRY ETCHING METHOD

CROSS-REFERENCE TO RELATED APPLICATIONS

The present application claims priority to Chinese Patent Application No. 201710824129.8, filed Sep. 13, 2017, and entitled "Dry Etching Method", the entire contents of which are incorporated herein by reference.

TECHNICAL FIELD

The present disclosure relates to the field of etching process technology, and in particular, to a dry etching method.

BACKGROUND

A dry etching process is required in a manufacturing process of a thin film transistor substrate. The dry etching process adopts plasma generated by a low-pressure gas under a high-frequency electric field to bombard the substrate, in this way, to perform etching. Specifically, on one hand, according to different materials of the substrate, a suitable gas can be selected to be reacted with the corresponding material to achieve the purpose of etching and removing. On the other hand, the electric field can be used to guide and accelerate the plasma to allow the plasma to have a certain kinetic energy, and when the plasma bombards a surface of the substrate, substances in the substrate will be knocked out, thereby achieving the purpose of etching by physical energy transfer.

When a sensor is integrated with the thin film transistor substrate, a dry-etching process is required to be performed on a silicon-containing thin film of a silicide material in the thin film transistor substrate. However, during the etching of the silicon-containing thin film by adopting a conventional dry etching process, damage to other films is serious, and dry etching quality cannot be guaranteed.

It is to be noted that the above information disclosed in this Background section is only for enhancement of understanding of the background of the present disclosure and therefore it may contain information that does not form the prior art that is already known to a person of ordinary skill in the art.

SUMMARY

An embodiment of the present disclosure provides a dry etching method, including:

etching a silicon-containing thin film with a first gas by a first preset thickness;

etching the silicon-containing thin film with a second gas by a second preset thickness, to remove etching residues generated after etching the silicon-containing thin film by the first preset thickness;

after the etching residues are removed, etching the silicon-containing thin film with the first gas by a third preset thickness, which is less than the first preset thickness;

wherein the first gas includes chlorine gas, and the second gas includes fluoride gas.

In an exemplary embodiment, a rate of etching a central portion of the silicon-containing thin film with the first gas is greater than a rate of etching edge portions of the silicon-containing thin film with the first gas; and a rate of etching the central portion of the silicon-containing thin film with the second gas is less than a rate of etching the edge portions of the silicon-containing thin film with the second gas.

In an exemplary embodiment, the first preset thickness is 55%-75% of a thickness of the silicon-containing thin film; the second preset thickness is 10%-30% of the thickness of the silicon-containing thin film; and
the third preset thickness is 10%-30% of the thickness of the silicon-containing thin film.

In an exemplary embodiment, the first gas includes sulfur hexafluoride gas, and a mass ratio of the sulfur hexafluoride gas to the chlorine gas in the first gas is 1:30 to 1:20.

In an exemplary embodiment, the second gas includes oxygen gas, and a mass ratio of the oxygen gas to the fluoride gas in the second gas is 1:500-1:1.5.

In an exemplary embodiment, the fluoride gas is sulfur hexafluoride gas or carbon tetrafluoride gas.

In an exemplary embodiment, the dry etching method has a dry etching temperature of 20-30 degrees Celsius.

In an exemplary embodiment, a gas pressure of any etching gas in the dry etching method ranges from 30 mTorr to 50 mTorr.

In an exemplary embodiment, the etching the silicon-containing thin film with a second gas by a second preset thickness, to remove etching residues on the silicon-containing thin film comprises an over-etching amount of etching the silicon-containing thin film by the second preset thickness being 10% to 20% of a rated etching amount.

In an exemplary embodiment, the etching the silicon-containing thin film with the first gas by a third preset thickness after the etching residues are removed includes an over-etching amount of etching the silicon-containing thin film by the third preset thickness being 15% to 20%.

An embodiment of the present disclosure provides a dry etching method for a thin film transistor substrate, including: etching a silicon-containing thin film with a first gas by a first preset thickness; etching the silicon-containing thin film with a second gas by a second preset thickness, to eliminate etching residues generated after etching the silicon-containing thin film by the first preset thickness; and after the etching residues are eliminated, etching the silicon-containing thin film with the first gas by a third preset thickness, the third preset thickness being less than the first preset thickness; wherein the first gas includes chlorine gas, and the second gas includes fluoride gas.

DETAILED DESCRIPTION

In order to further explain the technical means and effects of the present disclosure for achieving the intended purpose, specific embodiments, structures, features and effects of a dry etching method according to the present disclosure will be described below in detail with reference to the accompanying drawings and preferred embodiments.

In current manufacturing processes of semiconductor integrated circuits and LCDs, it is required to accurately control various materials to be formed into micrometer scale, meanwhile, the processes must have extremely high reproducibility, and a dry etching process can efficiently perform this work at a high yield. The dry etching process generally refers to an etching technique in which a glow discharge method is used to generate charged particles such as protecting ions, electrons, and plasmas having high chemical activity such as neutral atoms, molecules, and radicals for pattern transfer print. In the actual application process, the dry etching process may use an energy source to provide energy to the gases and generate the plasmas, and then atomic groups having high chemical activity are generated, the atomic groups are diffused to a surface of a substance to be etched, and is reacted with the substance to be etched to generate an reaction resultant having volatility, and at last, the reaction resultant is taken away, thus the dry etching process is completed.

Figure 1:
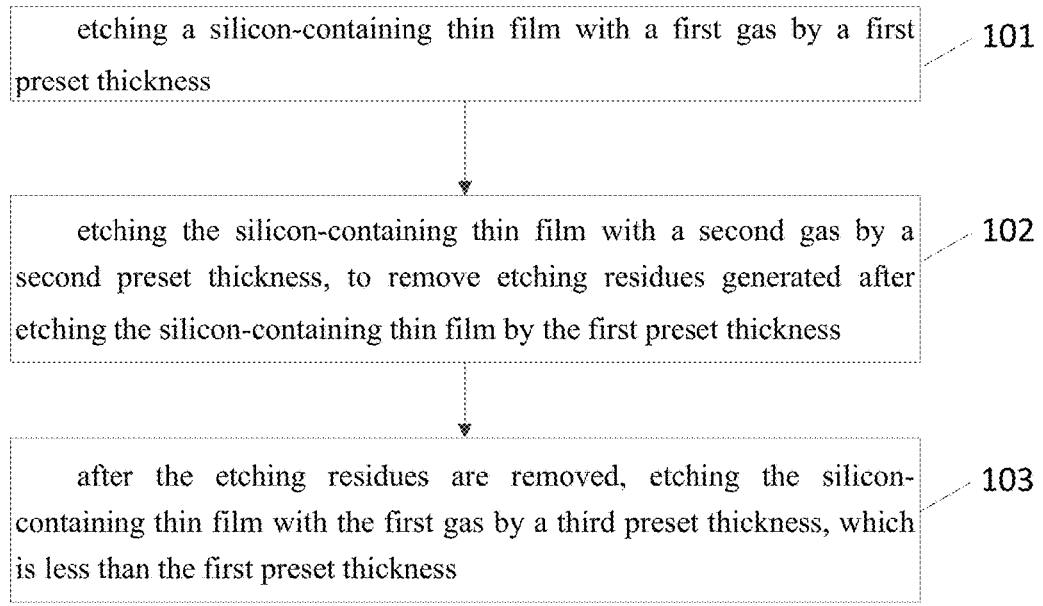
FIG. 1 is a process flow chart of a dry etching method according to an embodiment of the present disclosure.
Figure 2:
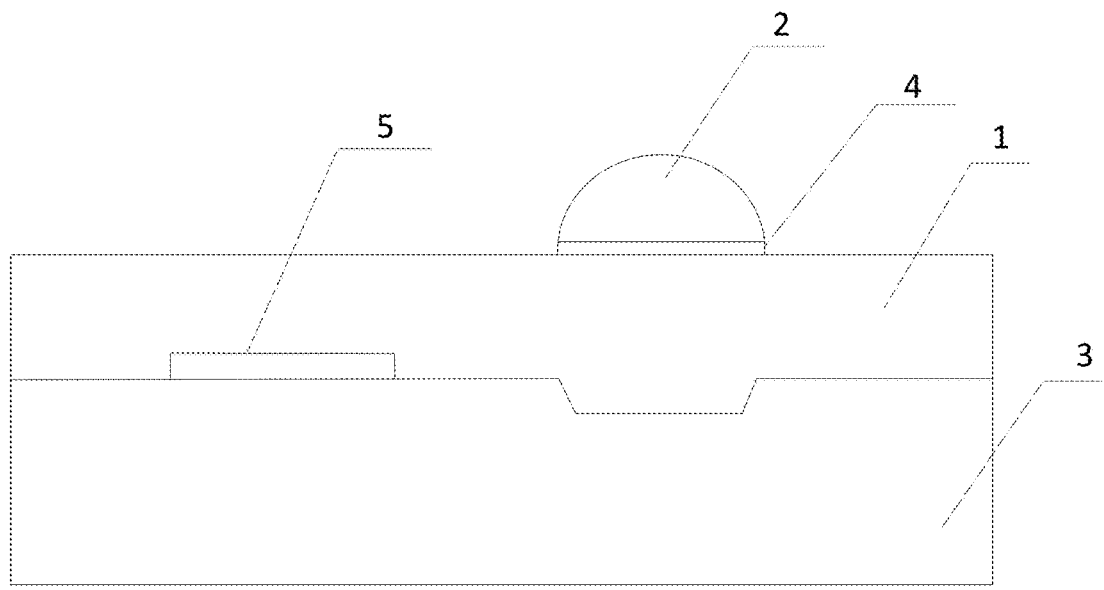
FIG. 2 is a structural schematic diagram of a thin film transistor substrate according to an embodiment of the present disclosure.

As shown in FIGS. 1 and 2, an embodiment of the present disclosure provides a dry etching method. The method includes the following steps:

In step 101, a silicon-containing thin film is etched with a first gas by a first preset thickness.

Figure 3:
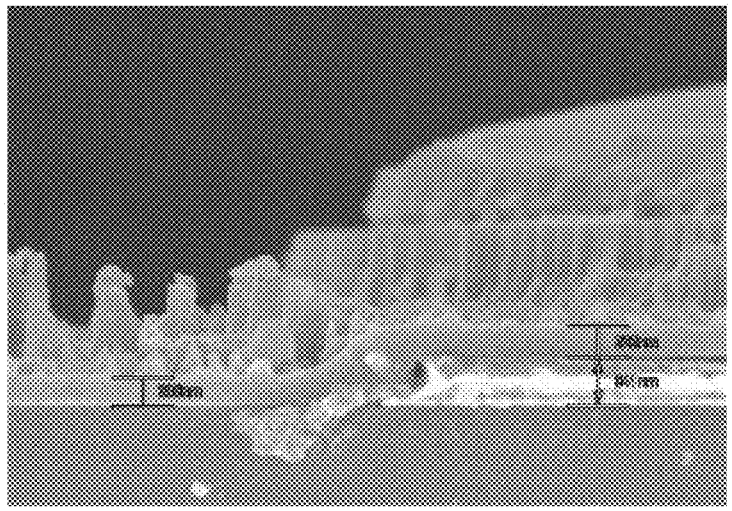
FIG. 3 is a structural schematic diagram of etching residues in a dry etching method according to an embodiment of the present disclosure.

A silicon-containing thin film 1 in a thin film transistor has a thickness of 1 μm. A photoresist layer 2 may be disposed above the silicon-containing thin film 1, and a passivation layer 3 may be disposed under the silicon-containing thin film 1, furthermore, a conductive glass 4 is disposed between the photoresist layer 2 and the silicon-containing thin film 1. The silicon-containing thin film 1 is configured to perform photoelectric conversion. The conductive glass 4 on the silicon-containing thin film 1 is configured to collect photocurrent. The photoresist layer 2 is configured to protect the conductive glass 4, wherein when the silicon-containing thin film is etched with the first gas, the damage to the photoresist layer 2 shall be minimized under the premise of the complete etching of the silicon-containing thin film, so as to protect the conductive glass 4 on the silicon-containing thin film 1. Specifically, the first gas includes chlorine gas, and the silicon-containing thin film 1 is etched with the chlorine gas at a pressure of 30-50 mTorr by the first preset thickness, which is 55% to 75% of the total thickness of the silicon-containing thin film 1. An etching degree to which the photoresist layer 2 is etched with the chlorine gas is lesser, while an etching degree to which the silicon-containing thin film 1 is etched with the chlorine gas is greater, thus the silicon-containing thin film 1 is etched with the chlorine gas by most of the thickness thereof to complete the main work of etching of the silicon-containing thin film 1. However, when the silicon-containing thin film 1 is etched with the chlorine gas, due to a secondary effect, as shown in FIG. 3, an reactant resulted from the reaction between the chlorine gas and the silicon-containing thin film 1 forms "grass-like" etching residues, and in order not to affect device performance, the above-mentioned etching residues can be removed in step 102 without causing a great influence on other films.

In step 102, the silicon-containing thin film 1 is etched with a second gas by a second preset thickness, to remove the etching residues, which are generated after etching the silicon-containing thin film 1 by the first preset thickness.

Figure 4:
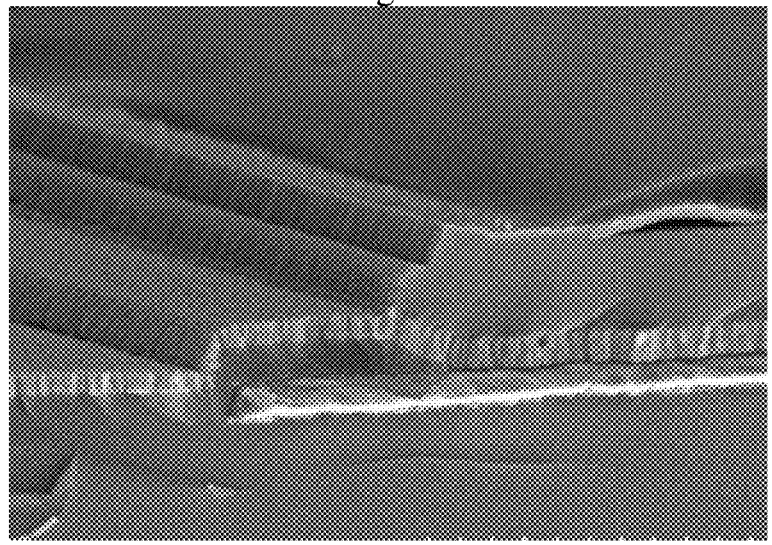
FIG. 4 is a structural schematic diagram of a silicon-containing thin film after etching residues are removed in a dry etching method according to an embodiment of the present disclosure.

The second gas includes fluoride gas, such as, sulfur hexafluoride gas or carbon tetrafluoride gas. The silicon-containing thin film 1 is etched with the fluoride gas at a pressure of 30-50 mTorr by the second preset thickness, which is 10% to 30% of the total thickness of the silicon-containing thin film 1. Because property of etching of the silicon-containing thin film 1 with the fluoride gas is strong, as shown in FIG. 4, the etching residues on the silicon-containing thin film may be removed by performing etching with the fluoride gas. However, because capability of etching of the photoresist layer 2 with the fluoride gas is also strong, in order to reduce the damage to the photoresist layer 2, an etching thickness of the fluoride gas shall be reduced as far as possible, that is to say, after the etching residues are eliminated, the etching with the fluoride gas shall be stopped. Moreover, after the silicon-containing thin film 1 is etched by the second preset thickness, it is necessary to reserve the silicon-containing thin film 1 having a specified thickness to avoid the damage to the passivation layer 3 caused by the fluoride gas.

In step 103, after the etching residues are eliminated, the silicon-containing thin film 1 is etched with the first gas by a third preset thickness, wherein the third preset thickness is smaller than the first preset thickness.

The silicon-containing thin film 1 is etched with the chlorine gas at a pressure of 30-50 mTorr by the third preset thickness, which is 10% to 30% of the total thickness of the silicon-containing thin film 1. An etching degree to which the passivation layer 3 and the photoresist layer 2 are etched with the chlorine gas is lesser, and the silicon-containing thin film 1 is completely etched with the chlorine gas by the remaining thickness, the damage to the passivation layer 3 can be reduced, this prevents large damage to the passivation layer 3 caused by the etching from affecting usage performance. In addition, in order to prevent long-time etching with the chlorine gas from producing the etching residues again, the third preset thickness may be decreased. Preferably, the third etching thickness may be 10% of the total thickness, in this way, the etching time will be short, and the etching residues will not be easily generated again, thus etching quality will be guaranteed.

An embodiment of the present disclosure provides a dry etching method for a thin film transistor substrate, including: etching a silicon-containing thin film with a first gas by a first preset thickness; etching the silicon-containing thin film with a second gas by a second preset thickness, to eliminate etching residues generated after etching the silicon-containing thin film by the first preset thickness; and after the etching residues are eliminated, etching the silicon-containing thin film with the first gas by a third preset thickness, the third preset thickness being less than the first preset thickness; wherein the first gas includes chlorine gas, and the second gas includes fluoride gas. In the present application, since the etching property of the second gas is strong, while the etching property of the first gas is weak, the silicon-containing thin film, which is remained after being etched with the second gas, is completely etched with the first gas, this can avoid large damage, caused by performing etching with the second gas, to the passivation layer under the silicon-containing thin film, and because the thickness of the remaining silicon-containing thin film after being etched by the second gas is small, the etching time will be short, in this way, no etching residues will be produced in the etching of the silicon-containing thin film with the first gas in a short time, it not only prevents etching residues from occurring for the second time, but also reduces damage to other thin films, thus the etching quality can be improved.

In an exemplary embodiment a rate of etching a central portion of the silicon-containing thin film 1 with the first gas is greater than a rate of etching edge portions of the silicon-containing thin film with the first gas; and a rate of etching the central portion of the silicon-containing thin film 1 with the second gas is less than a rate of etching the edge portions of the silicon-containing thin film with the second gas. In this embodiment, when the silicon-containing thin film 1 is etched with the etching gases, the etching uniformity of the etching gases cannot be guaranteed due to objective factors, and in order to ensure the etching uniformity, in step 101, efficiency of etching the central portion of the silicon-containing thin film 1 with the first gas is greater than efficiency of etching the edge portions of the silicon-containing thin film 1 with the first gas, thus the central portion of the silicon-containing thin film 1 is in a recessed state after the etching, and then, in step 102, efficiency of etching the central portion of the silicon-containing thin film 1 with the second gas is less than efficiency of etching the edge portions of the silicon-containing thin film 1 with the second gas, thus a thickness of the central portion and a thickness of the edge portions of the silicon-containing thin film 1 can be flush with each other, in this way, the etching uniformity of the silicon-containing thin film 1 can be ensured.

In order to further improve the etching efficiency of the above-described dry etching method, optionally, the first gas includes sulfur hexafluoride gas, and a mass ratio of the sulfur hexafluoride gas to the chlorine gas in the first gas is 1:30-1:20. In this embodiment, since the sulfur hexafluoride gas may be also used for etching the silicon-containing thin film 1, and the etching property of the sulfur hexafluoride gas is stronger than the etching property of the chlorine gas, the addition of a small amount of the sulfur hexafluoride gas in the first gas may improve the efficiency of etching the silicon-containing thin film 1 with the first gas.

In order to further improve the etching efficiency of the above-described dry etching method, in an embodiment, the second gas includes oxygen gas, and a mass ratio of the oxygen gas to the fluoride gas in the second gas is 1:500-1:1.5. In this embodiment, when the silicon-containing thin film 1 is etched by the fluoride gas, the oxygen gas acts as a catalyst to increase the efficiency of reaction between the fluoride gas and the silicon-containing thin film 1, and to increase an etching speed.

In an exemplary embodiment, the above-described dry etching method has a dry etching temperature of 20-30 degrees Celsius. In this embodiment, in addition to the passivation layer 3, a light shielding layer 5 is disposed under the silicon-containing thin film 1, and an active layer is disposed under the light shielding layer 5, which may shield light for the active layer. The main component of the light shielding layer 5 is Mo, and when a dry etching process is performed in an environment with a low dry etching temperature, a resultant from Mo after being etched is difficult to be volatilized, thereby reducing the damage to an LS layer and improving a dry etching quality.

In an exemplary embodiment, a gas pressure of any etching gas in the dry etching method ranges from 30 mTorr to 50 mTorr. Specifically, the gas pressure of the chlorine gas, the sulfur hexafluoride gas, the carbon tetrafluoride gas and the oxygen gas in the above embodiments ranges from 30 mTorr to 50 mTorr, wherein the gas pressure of the etching gases mainly affects the etching uniformity. In this embodiment, the gas pressure of the etching gases is in the range of 30-50 mTorr, which can well maintain the uniformity of the dry etching of the silicon-containing thin film 1 and improve the dry etching quality.

In an exemplary embodiment, the step 102 of etching the silicon-containing thin film 1 by a second preset thickness with the second gas to remove etching residue on the silicon-containing thin film 1 includes an over-etching amount of etching the silicon-containing thin film 1 by the second preset thickness being 10% to 20% of a rated etching amount. In this embodiment, the rated etching amount is a theoretical etching amount obtained by calculation. When the silicon-containing thin film 1 is etched, the rated etching amount obtained by the calculation often cannot reach a preset etching thickness due to various objective factors, and in order to reach the preset etching thickness, it is usually necessary to increase the over-etching amount on the basis of the rated etching amount, which is the theoretical etching amount obtained by the calculation, and the over-etching amount is mainly set according to the preset etching thickness.

In an exemplary embodiment, the step 103 of etching the silicon-containing thin film 1 with the first gas by a third preset thickness after the etching residues are eliminated includes the over-etching amount of etching the silicon-containing thin film by the third preset thickness being 15% to 20% of the rated etching amount. In this embodiment, the rated etching amount is a theoretical etching amount obtained by calculation. When the silicon-containing thin film 1 is etched, the rated etching amount obtained by the calculation often cannot reach a preset etching thickness due to various objective factors, and in order to reach the preset etching thickness, it is usually necessary to increase the over-etching amount on the basis of the rated etching amount, which is theoretically calculated, and the over-etching amount is mainly set according to the preset etching thickness.

An embodiment of the present disclosure provides a dry etching method for a thin film transistor substrate, including: etching a silicon-containing thin film with a first gas by a first preset thickness; etching the silicon-containing thin film with a second gas by a second preset thickness, to eliminate etching residues generated after etching the silicon-containing thin film by the first preset thickness; after the etching residues are eliminated, etching the silicon-containing thin film with the first gas by a third preset thickness, which is less than the first preset thickness; wherein the first gas includes chlorine gas, and the second gas includes fluoride gas. In the present application, since the etching property of the second gas is strong, while the etching property of the first gas is weak, the silicon-containing thin film, which is remained after being etched with the second gas, is completely etched with the first gas, this can avoid large damage, caused by performing etching with the second gas, to the passivation layer under the silicon-containing thin film, and because the thickness of the remaining silicon-containing thin film after being etched by the second gas is small, the etching time will be short, in this way, no etching residues will be produced in the etching of the silicon-containing thin film with the first gas in a short time, it not only prevents etching residues from occurring for the second time, but also reduces damage to other thin films, thus the etching quality can be improved.

Embodiment 1

The embodiment of the present disclosure provides a dry etching method, including:

etching a silicon-containing thin film with chlorine gas and sulfur hexafluoride gas at a gas pressure of 45 mTorr by 70% of a thickness of the silicon-containing thin film, wherein a mass ratio of the sulfur hexafluoride gas to the chlorine gas is 1:30;

etching the silicon-containing thin film with oxygen gas and carbon tetrafluoride gas at a gas pressure of 45 mTorr by 20% of the thickness of the silicon-containing thin film, wherein a mass ratio of the oxygen gas to the carbon tetrafluoride gas is 1:5, and an over-etching amount is 10%; and etching the silicon-containing thin film with the chlorine gas and the sulfur hexafluoride gas at a gas pressure of 45 mTorr by 10% of the thickness of the silicon-containing thin film, wherein a mass ratio of the sulfur hexafluoride gas to the chlorine gas is 1:30, and an over-etching amount is 20%.

A dry etching temperature of the above-described dry etching temperature is 20 degrees Celsius.

Embodiment 2

The embodiment of the present disclosure provides a dry etching method, including:

etching a silicon-containing thin film with chlorine gas and sulfur hexafluoride gas at a gas pressure of 30 mTorr by 55% of a thickness of the silicon-containing thin film, wherein a mass ratio of the sulfur hexafluoride gas to the chlorine gas is 1:30;

etching the silicon-containing thin film with oxygen gas and carbon tetrafluoride gas at a gas pressure of 30 mTorr by 30% of the thickness of the silicon-containing thin film, wherein a mass ratio of the oxygen gas to the carbon tetrafluoride gas is 1:1.5, and an over-etching amount is 20%; and etching the silicon-containing thin film with the chlorine gas and the sulfur hexafluoride having a gas pressure of 30 mTorr by 15% of the thickness of the silicon-containing thin film, wherein a mass ratio of the sulfur hexafluoride gas to the chlorine gas is 1:20, and an over-etching amount is 15%.

A dry etching temperature of the above-described dry etching method is 30 degrees Celsius.

Embodiment 3

The embodiment of the present disclosure provides a dry etching method, including:

etching a silicon-containing thin film with chlorine gas and sulfur hexafluoride gas at a gas pressure of 30 mTorr by 75% of a thickness of the silicon-containing thin film, wherein a mass ratio of the sulfur hexafluoride gas to the chlorine gas is 1:20;

etching the silicon-containing thin film with oxygen gas and carbon tetrafluoride gas at a gas pressure of 30 mTorr by 15% of the thickness of the silicon-containing thin film, wherein a mass ratio of the oxygen gas to the carbon tetrafluoride gas is 1:10, and an over-etching amount is 10%; and etching the silicon-containing thin film with the chlorine gas and the sulfur hexafluoride gas at a gas pressure of 30 mTorr by 10% of the thickness of the silicon-containing thin film, wherein a mass ratio of the sulfur hexafluoride gas to the chlorine gas is 1:20, and an over-etching amount of 15%.

A dry etching temperature of the above-described dry etching method is 25 degrees Celsius.

The above-described contents are only specific embodiments of the present disclosure, but the protection scope of the present disclosure is not limited thereto, and within the technical scope of the present disclosure, any person skilled in the art can easily think of changes or substitutions should be covered by the protection scope of the present disclosure. Therefore, the protection scope of the present disclosure shall be defined by the appended claims.

What is claimed is:

1. A dry etching method, comprising:
   etching a silicon-containing thin film with a first gas by a first preset thickness;
   etching the silicon-containing thin film with a second gas by a second preset thickness, to remove etching residues generated after etching the silicon-containing thin film by the first preset thickness;
   after the etching residues are removed, etching the silicon-containing thin film with the first gas by a third preset thickness, and the third preset thickness is less than the first preset thickness;
   wherein the first gas comprises chlorine gas, and the second gas comprises fluoride gas.

2. The dry etching method according to claim 1, wherein
   a rate of etching a central portion of the silicon-containing thin film with the first gas is greater than a rate of etching edge portions of the silicon-containing thin film with the first gas; and
   a rate of etching the central portion of the silicon-containing thin film with the second gas is less than a rate of etching the edge portions of the silicon-containing thin film with the second gas.

3. The dry etching method according to claim 1, wherein
   the first preset thickness is 55%-75% of a thickness of the silicon-containing thin film;
   the second preset thickness is 10%-30% of the thickness of the silicon-containing thin film; and
   the third preset thickness is 10%-30% of the thickness of the silicon-containing thin film.

4. The dry etching method according to claim 1, wherein the first gas comprises sulfur hexafluoride gas, and a mass ratio of the sulfur hexafluoride gas to the chlorine gas in the first gas is 1:30 to 1:20.

5. The dry etching method according to claim 1, wherein the second gas comprises oxygen gas, and a mass ratio of the oxygen gas to the fluoride gas in the second gas is 1:500-1:1.5.

6. The dry etching method according to claim 1, wherein the fluoride gas is sulfur hexafluoride gas or carbon tetrafluoride gas.

7. The dry etching method according to claim 1, wherein the dry etching method has a dry etching temperature of 20-30 degrees Celsius.

8. The dry etching method according to claim 1, wherein a gas pressure of any etching gas in the dry etching method ranges from 30 mTorr to 50 mTorr.

9. The dry etching method according to claim 2, wherein a gas pressure of any etching gas in the dry etching method ranges from 30 mTorr to 50 mTorr.

10. The dry etching method according to claim 3, wherein a gas pressure of any etching gas in the dry etching method ranges from 30 mTorr to 50 mTorr.

11. The dry etching method according to claim 4, wherein a gas pressure of any etching gas in the dry etching method ranges from 30 mTorr to 50 mTorr.

12. The dry etching method according to claim 5, wherein a gas pressure of any etching gas in the dry etching method ranges from 30 mTorr to 50 mTorr.

13. The dry etching method according to claim 6, wherein a gas pressure of any etching gas in the dry etching method ranges from 30 mTorr to 50 mTorr.

14. The dry etching method according to claim 7, wherein a gas pressure of any etching gas in the dry etching method ranges from 30 mTorr to 50 mTorr.

15. The dry etching method according to claim 1, wherein The step of etching the silicon-containing thin film with a second gas by a second preset thickness, to remove etching residues on the silicon-containing thin film comprises an over-etching amount of etching the silicon-containing thin film by the second preset thickness being 10% to 20% of a rated etching amount.

16. The dry etching method according to claim 1, wherein the step of etching the silicon-containing thin film with the first gas by a third preset thickness after the etching residues are removed comprises an over-etching amount of etching the silicon-containing thin film by the third preset thickness being 15% to 20%.

* * * * *